United States Patent [19]
Levine

[11] Patent Number: 5,579,243
[45] Date of Patent: Nov. 26, 1996

[54] MODAL PARAMETER ESTIMATION FOR STABLE FILTERS

[75] Inventor: Ronald H. Levine, Woodbridge, Conn.

[73] Assignee: Lucent Technologies Inc., Murray Hill, N.J.

[21] Appl. No.: 309,281

[22] Filed: Sep. 20, 1994

[51] Int. Cl.$^6$ .................................................. G06F 17/11
[52] U.S. Cl. ...................... 364/553; 364/572; 364/724.01
[58] Field of Search ................................... 364/553, 572, 364/724.01; 181/103; 375/227, 228, 290; 381/92, 94, 71, 96–99; 342/91, 159, 201

[56] References Cited

U.S. PATENT DOCUMENTS

| | | | |
|---|---|---|---|
| 4,210,966 | 7/1980 | Ingram | 367/27 |
| 4,384,354 | 5/1983 | Crawford et al. | 375/227 |
| 4,654,808 | 3/1987 | Potter et al. | 364/553 |
| 4,713,782 | 12/1987 | Blackham | 364/553 |
| 4,825,449 | 4/1989 | McKissock | 375/228 |
| 4,947,480 | 8/1990 | Lewis | 364/572 |
| 5,210,705 | 5/1993 | Chauvel et al. | 364/724.01 |
| 5,224,170 | 6/1993 | Waite, Jr. | 381/92 |
| 5,251,155 | 10/1993 | Adachi | 364/553 |
| 5,294,933 | 3/1994 | Lee et al. | 342/159 |
| 5,418,858 | 5/1995 | Shoureshi | 381/94 |

OTHER PUBLICATIONS

M. H. Richardson et al., "Parameter Estimation From Frequency Response Measurements Using Rational Fraction Polynomials", First International Modal Analysis Conference, 1992, pp. 167–181.

H. Vold, "Numerically Robust Frequency Domain Modal Parameter Estimation," Sound and Vibration, 1990, pp. 38–40.

*Primary Examiner*—Emanuel T. Voeltz
*Assistant Examiner*—Hal D. Wachsman

[57] ABSTRACT

A filter synthesizer and method are disclosed for generating and outputting a stable filter from frequency response data, including coherence values. A processing unit has a processor, memory, and stored programs. The processor, operating the modal analysis program, processes the frequency response data, generates orthogonal polynomial data from a cost function of the frequency response data including coherence values, and generates the modal parameters of a transfer function from the orthogonal polynomial data, which represents Forsythe polynomials. The processor generates the orthogonal polynomial data from least squares processing the cost function of the frequency response data, including coherence values. The processor generates the modal parameters, including a pole of the transfer function, and determines an instability condition from the pole. If a pole is unstable, the processor refits the frequency response data to generate a stable transfer function. A least squares optimization procedure is performed on the frequency response data, including the coherence values. A residue is generated corresponding to a pole, and the residue is revised in response to a condition of the pole being unstable. The modal parameters are generated by determining a companion matrix from the first orthogonal polynomial data and the frequency response data; performing QR decomposition on the companion matrix; and generating a pole as a eigenvalue of the companion matrix from the QR decomposition.

20 Claims, 5 Drawing Sheets

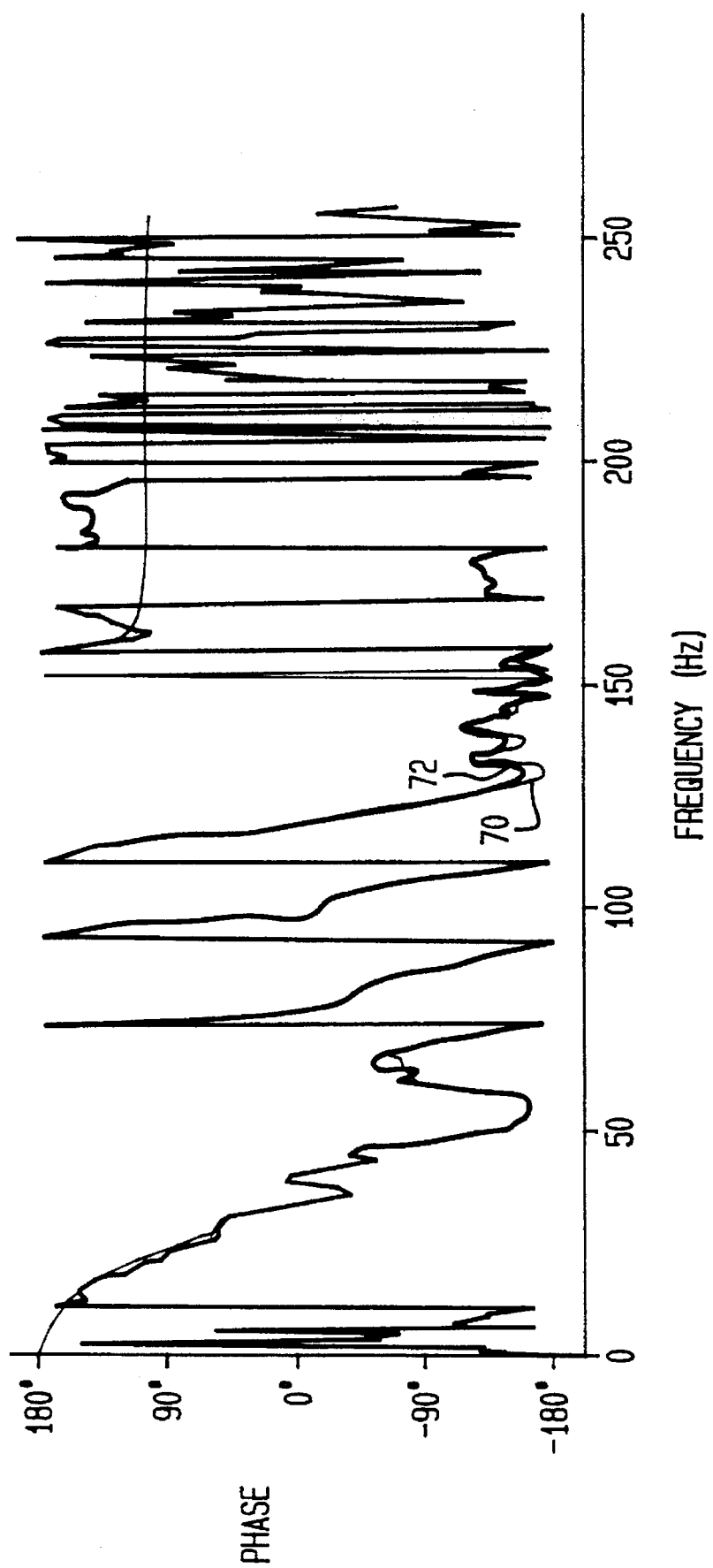

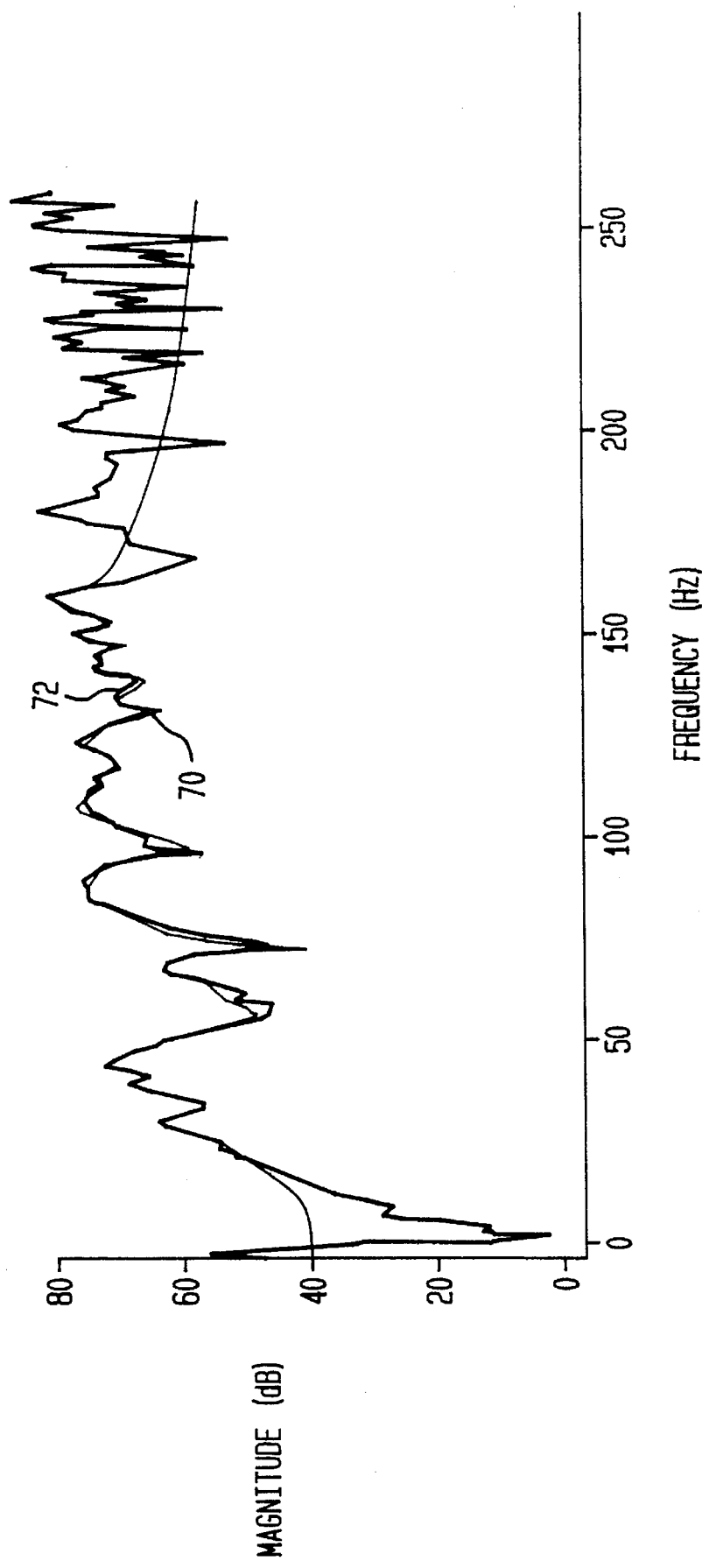

5,579,243

MODAL PARAMETER ESTIMATION FOR STABLE FILTERS

BACKGROUND OF THE INVENTION

1. Field of the Invention

This disclosure relates to filter synthesizers for frequency response systems, and in particular, to an apparatus and method for estimating modal parameters of a transfer function to generate stable filters.

2. Description of the Related Art

Frequency response systems, i.e. mechanical, acoustical, or electrical system having an output value dependent on an input frequency, may be modelled as filters on the frequency response data by transfer functions of the input frequencies. Transfer functions or frequency response functions may be formulated in terms of modal parameters such as number of modes, undamped natural frequency, damping ratio, and residues, or zeroes and poles, and equivalently may be formulated as the ratio of polynomials, with such formulations of the transfer function allowing a corresponding filter to be constructed or synthesized which indicates the general behavior of the frequency response system.

However, for systems requiring higher order polynomials and/or equations to accurately model the input frequency response data, calculation of the transfer function or filter from the corresponding frequency response data may be computational ill-conditioned due to numerical round-off errors.

The computed filter may also have unstable poles, making the filter unstable. The disclosed system and method creates stable filters.

SUMMARY

A filter synthesizer apparatus and method are disclosed for generating modal parameters of a frequency response system to determine a stable filter. The filter synthesizer includes a processing unit including a processor, associated memory, and stored programs, with the memory for storing frequency response data of the frequency response system, including coherence values; the stored programs include an interactive modal analysis computer program; and the processor, operating the modal analysis program, for processing the frequency response data, for generating orthogonal polynomial data from a cost function of the frequency response data including coherence values, and for generating the modal parameters of a transfer function from the orthogonal polynomial data.

A data source provides the frequency response data to the processing unit for storing in the memory, and the processor generates the orthogonal polynomial data representing Forsythe polynomials. The processor generates the orthogonal polynomial data from least squares processing the cost function of the frequency response data, including coherence values. The processor generates the modal parameters, including the pole of the transfer function, and determines an instability condition from the pole. If a pole is unstable, the processor responds to the instability condition to generate a second set of orthogonal polynomial data corresponding to a stable transfer function, and generates the modal parameters from the second orthogonal polynomial data.

A method is disclosed for generating the modal parameters of the frequency response system, and includes the steps of storing frequency response data, including coherence values, representing the frequency response system in memory; processing the frequency response data using a processor; minimizing a cost function of the frequency response data, including the coherence values; generating first orthogonal polynomial data corresponding to a transfer function of the frequency response system using the processor operating a modal analysis program; and generating the modal parameters from the first orthogonal polynomial data.

A least squares optimization procedure is performed on the frequency response data, including the coherence values. The step of generating includes generating Forsythe polynomials from the frequency response data. A residue is generated corresponding to a pole, and the residue is revised in response to a condition of the pole being unstable. The modal parameters are generated by determining a companion matrix from the first orthogonal polynomial data and the frequency response data; performing QR decomposition on the companion matrix; and generating a pole as a eigenvalue of the companion matrix from the QR decomposition.

The method also includes the step of determining a condition of an unstable pole of the transfer function; generating a stable pole; refitting the frequency response data using the stable pole to generate second orthogonal polynomial data; and generating a stable transfer function from the second orthogonal polynomial data. The generation of a stable pole includes the step of reflecting the unstable pole about the imaginary axis in the s domain; and the step of refitting includes the step of using the reflected unstable pole to generate the second orthogonal polynomial data therefrom.

BRIEF DESCRIPTION OF THE DRAWINGS

The features of the disclosed filter synthesizer and method will become more readily apparent and may be better understood by referring to the following detailed description of an illustrative embodiment of the present invention, taken in conjunction with the accompanying drawings, where:

FIG. 4 illustrates an example transfer function phase vs. frequency graphical representation; and FIG. 5 illustrates an example transfer function magnitude vs. frequency graphical representation.

DESCRIPTION OF THE PREFERRED EMBODIMENTS

Figure 1:
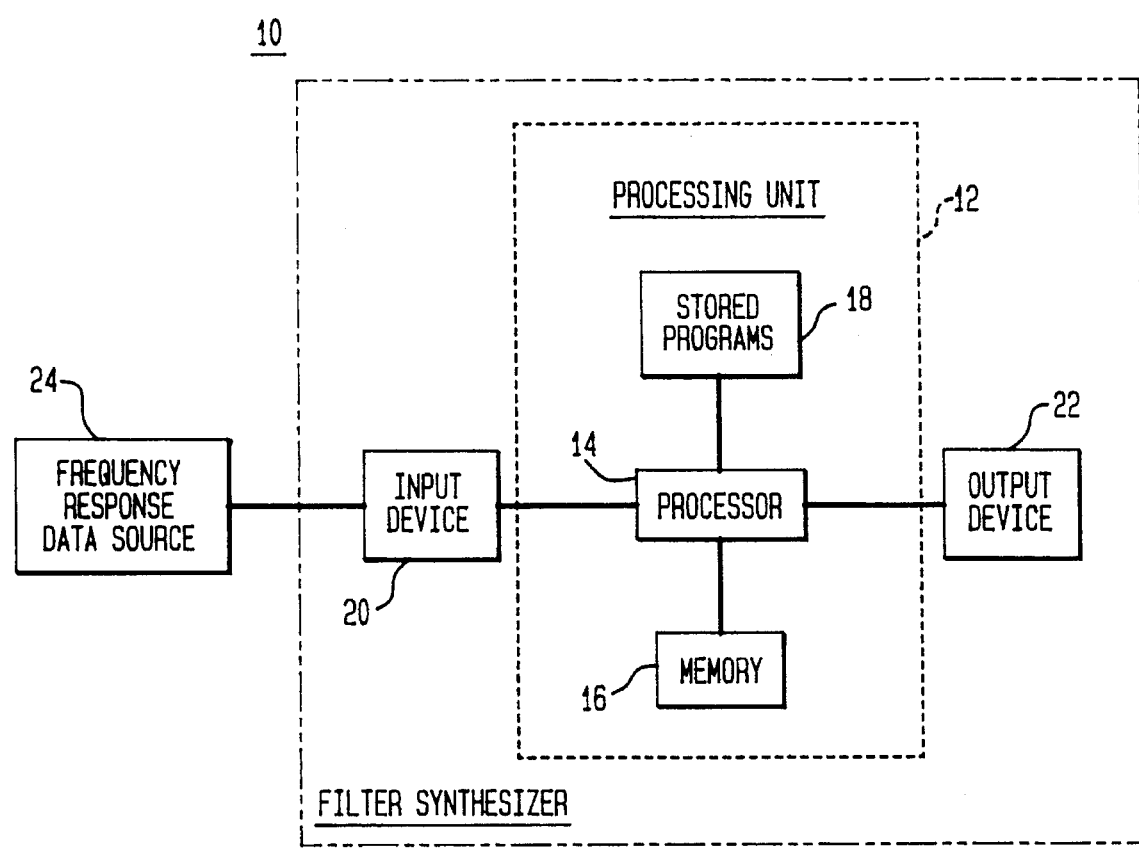
FIG. 1 shows the components of the filter synthesizer disclosed herein.

Referring now in specific detail to the drawings, with like reference numerals identifying similar or identical elements, as shown in FIG. 1, the present disclosure describes an apparatus and method implementing a filter synthesizer 10, which includes a processing unit 12 having a processor 14, memory 16, and stored programs 18 including an interactive modal analysis computer program; an input device 20; and an output device 22. In an exemplary embodiment, the processing unit 12 is preferably a SPARC workstation available from Sun Microsystems, Inc. having about 10 MB associated RAM memory and a hard or fixed drive as memory 16. The processor 14 operates using the UNIX operating system to run application software as the stored programs 18 providing programs and subroutines implementing the disclosed filter synthesizer apparatus and methods.

The processor 14 receives commands and frequency response data from a frequency response data source 24 through the input device 20 which includes a keyboard, a mouse, and/or a data reading device such as a disk drive for receiving the transfer function data in input data files from storage media such as a floppy disk or an 8 mm storage tape. The received frequency response data are stored in memory 16 for further processing to generate stable filters. In addition, through the input device, the user can select the band to fit using the mouse, and the corresponding number of modes to generate modal parameters. The band to fit is a frequency sub-band of the total spectrum of frequencies of the input frequency response data for fitting the frequency response data to a transfer function within the specified sub-band.

The generated modal parameters including the undamped natural frequency, damping ratio, residues, and other transfer function data characterizing the synthesized stable filter is sent to the output device 22 such as a display for display thereof. Alternatively, the output device 22 may include specialized graphics programs to convert the generated stable filter data to a displayed graphic, such as shown in FIGS. 4–5. In additional embodiments, the generated filter data may include determined poles and/or zeros listed in a file for output as columns or tables of text by the output device 22 which may be a display or a hard copy printer.

The filter synthesizer 10 performs the application programs and subroutines, described hereinbelow in conjunction with FIGS. 2–3, which are implemented from compiled source code in the FORTRAN and/or the C programming languages. It is understood that one skilled in the art would be able to use other programming languages such as C++ to implement the disclosed filter synthesizer apparatus and method.

The filter synthesizer 10 also includes a method for generating the transfer function and modal parameters corresponding to a filter providing an optimal fit to the input frequency response data. As shown in FIG. 2, the method generates the transfer function and modal parameters including the steps of: starting the generation of modal parameters of the frequency response system in step 26; receiving into memory from a data source frequency response data, including coherence values, representing the frequency response system in step 28; receiving input values, including a transfer function frequency sub-band and/or number of modes in step 30; normalizing the frequency response data with respect to a maximum frequency determined by the processor in step 32; and minimizing a cost function of the frequency response data in step 34 by performing a least squares optimization of the cost function of the frequency response data, including the coherence values in step 36.

The method further includes the steps of generate orthogonal polynomial data representing Forsythe polynomials using the processor operating a modal analysis program in step 38; generating the transfer function and modal parameters of the frequency response system representing a synthesized filter in step 40; and outputting the modal parameters in step 42. The step of outputting may further include the steps of displaying modal parameters in step 44; displaying polynomial coefficients in step 46; and generating a graphical representation of the frequency response data and the stable filter in step 48.

Figure 2:
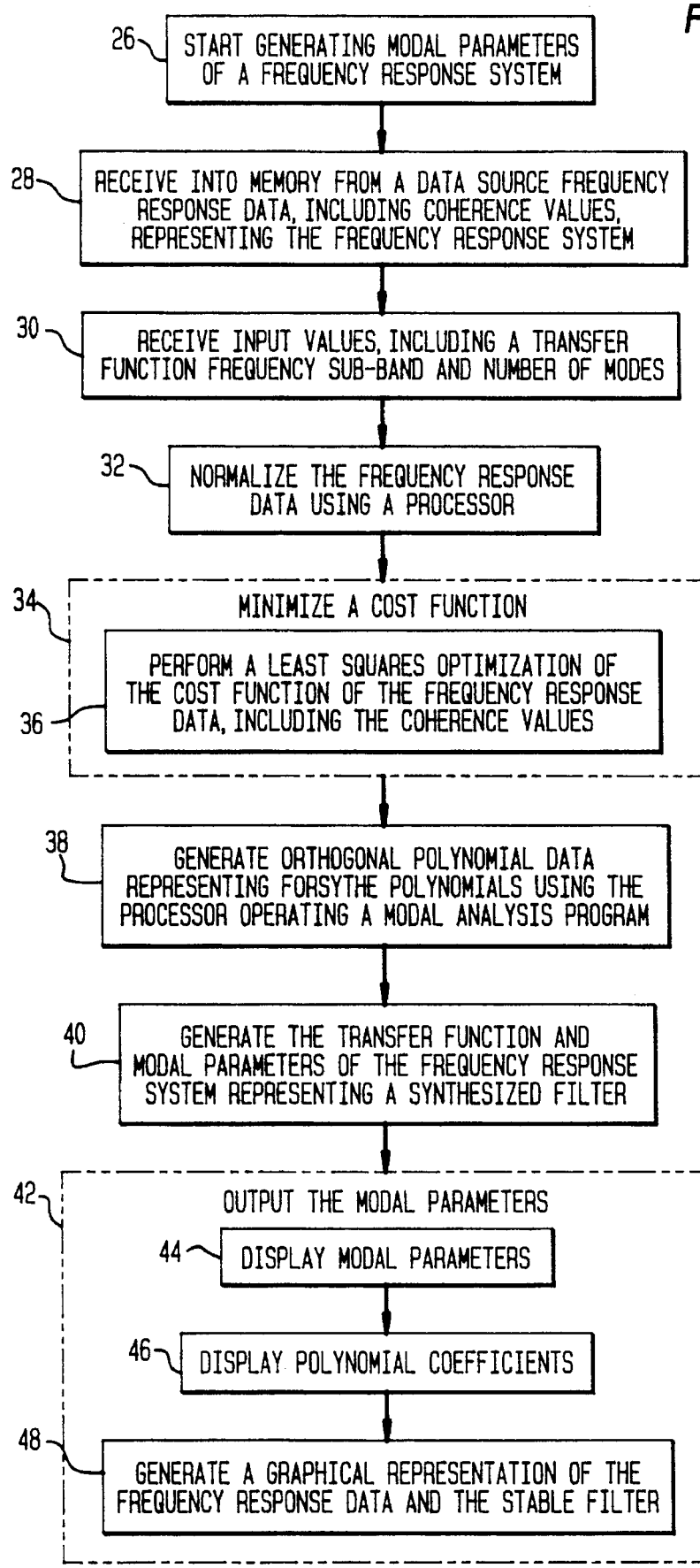
FIG. 2 illustrates a block diagram of the operation of the filter synthesizer.
Figure 3:
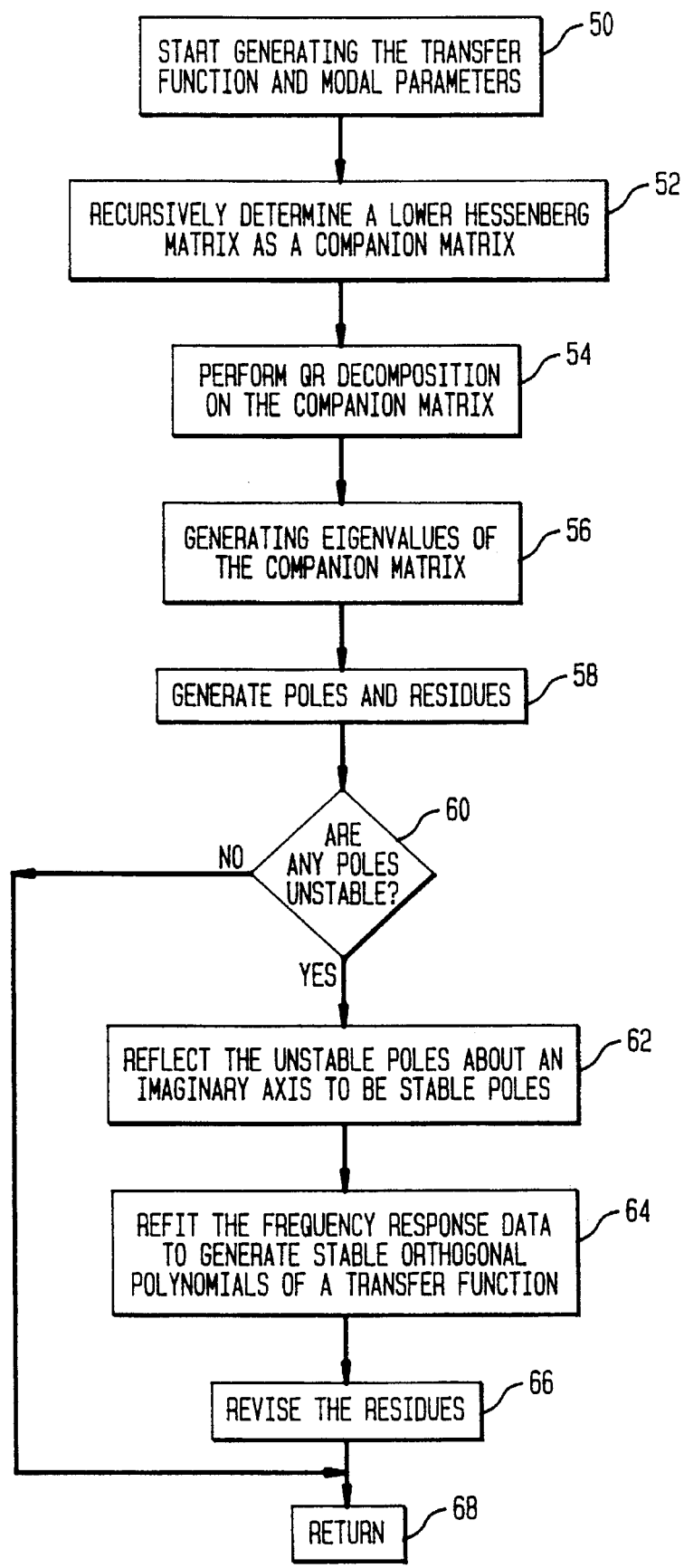
FIG. 3 illustrates a block diagram of the generation of modal parameters of the generated filter.

As shown in FIG. 3, the generating of the transfer function and modal parameters in step 40 of FIG. 2 includes the steps of starting the generating of the transfer function and modal parameters in step 50; recursively determining a lower Hessenberg matrix as a companion matrix in step 52; performing QR decomposition on the companion matrix in step 54; generating eigenvalues of the companion matrix in step 56; and generate poles and residues in step 58. The method then determines if any poles are unstable in step 60. If no poles are unstable, then the generated poles and residues are unchanged and the method returns in step 62 to perform step 42 in FIG. 2.

However, if there are any unstable poles as determined in step 60, then the method in FIG. 3 reflects the unstable poles about an imaginary axis to be stable poles in step 64; refits the frequency response data to generate stable orthogonal polynomials of a transfer function in step 66; and revises the residues in step 68. The method then returns the stable orthogonal polynomial in step 62 to continue to step 42 in FIG. 2.

The filter synthesizer 10 is applicable to mechanical, acoustical, and electrical frequency response functions to creates stable analog or digital filters from determined modal parameters to model the input frequency response data. Referring to FIG. 2, the modal parameters are found by normalizing the frequency response data in step 32 and by least square fitting the coherence weighted error between a rational fraction polynomial model and the transfer function data $h_i$ which is input to the filter synthesizer 10 through the input device 20 using an input data file. The disclosed method is well conditioned because of the use of Forsythe orthogonal polynomials, because the method remains in the orthogonal domain, and because the roots of the transfer function are found by using a companion matrix formulation. The modal parameters generates a stable filter by reflecting any unstable poles about the imaginary axis and refitting the numerator. Unstable poles are herein defined as poles having a positive real part and causing the corresponding transfer function to be computationally unstable.

For a linear structure with viscous damping, the form of the frequency response transfer function is:

$$H(s) = \sum_{r=1}^{\text{MODES}} \left[ \frac{A_r}{s - p_r} + \frac{A_r^*}{s - p_r^*} \right]_{s=j\omega} \quad (1)$$

where:

$$p_{r^*} = -\zeta_r \omega_r + j\omega_r \sqrt{1 - \zeta_r^2} \quad (2)$$

and $\omega_r$ are undamped natural frequencies, in radians; $\zeta_r$ are damping ratios; $A_r$ are complex residues; and MODES are the number of modes. $A_r$ may be expressed as $A_r = R_r + j\, I_r$, with complex parts $R_r = \text{Re}(A_r)$ and $I_r = \text{Im}(A_r)$. Illustrated values $R_r$ and $I_r$ and corresponding output modal parameter values are shown in TABLE 2 below. MODES is specified by the user for fitting the input frequency response data to transfer functions as per Eq. (1). Alternatively, the MODES variable may be set by default to a value predetermined by the computational limitations of the processing unit 10. In an additional embodiment, the MODES variable may be determined as an optimal value within a range of values of MODES determined from multiple iterations of the disclosed filter synthesizer methods to generate an optimally fitting transfer function from the frequency response data.

The transfer function in Eq. (1) may also be expressed in a rational fraction form with either ordinary or orthogonal polynomials:

$$H(s_i) = \frac{\sum_{k=0}^{M} a_k s_i^k}{\sum_{k=0}^{N} b_k s_i^k} = \frac{\sum_{k=0}^{M} c_k \phi_{i,k}(s_i)}{\sum_{k=0}^{N} d_k \theta_{i,k}(s_i)} = \frac{N(s_i)}{D(s_i)} \quad (3)$$

where:

- $a_k$ are the unknown numerator coefficients for ordinary polynomials;
- $b_k$ are the unknown denominator coefficients for ordinary polynomials;
- $c_k$ are the unknown numerator coefficients for orthogonal polynomials;
- $d_k$ are the unknown denominator coefficients for orthogonal polynomials;
- M are the order of the numerator polynomial for orthogonal polynomial, where M=2 * MODES−1;
- N are the order of the denominator polynomial for orthogonal polynomial, where N=2 * MODES;
- $s_i = j\omega_i$ which is the Laplace domain value at the $i^{th}$ frequency;
- $\phi_{i,k}$ is the $k^{th}$ order numerator Forsythe orthogonal polynomials evaluated at frequency $\omega_i$; and
- $\theta_{i,k}$ is the $k^{th}$ order denominator Forsythe orthogonal polynomials evaluated at frequency $\omega_i$.

The filter synthesizer system and method applies a least squares formulation using Forsythe orthogonal polynomials.

GENERATION OF COMPLEX FORSYTHE POLYNOMIALS

The Forsythe polynomials are defined as follows:

$P_{i,-1} = 0$ $P_{i,0} = 1$ $P_{i,1} = (X_i - U_i) P_{i,0}$ \quad (4)

$P_{i,k} = (X_i - U_k) P_{i,k-1} - V_{k-1} P_{i,k-2}$ where the order of the Forsythe polynomial is k=2,3, ... and the frequencies are indexed by the index i where i=−L, ... ,−1, 1, ..., L, where L is the number of input frequencies. In the above equations, $$U_k = \sum_{i=-L}^{L} X_i |P_{i,k-1}|^2 q_i / D_{k-1} \quad (5)$$

$$V_{k-1} = \sum_{i=-L}^{L} X_i P_{i,k-1} P^*_{i,k-2} q_i / D_{k-2}$$

$$D_k = \sum_{i=-L}^{L} |P_{i,k}|^2 q_i$$

and $X_i = s = j\omega_i = i^{th}$ frequency value; $q_i$=a value of a weighting function at the $i^{th}$ frequency; and $P_{i,k} = k^{th}$ order complex polynomial at the $i^{th}$ frequency.

In the present disclosure, $\phi_{i,k} = P_{i,k}$ is the $k^{th}$ order numerator Forsythe orthogonal polynomials evaluated at frequency $\omega_i$; and $\theta_{i,k} = P_{i,k}$ is the $k^{th}$ order denominator Forsythe orthogonal polynomials evaluated at frequency $\omega_i$.

The weighting functions $q_i = \gamma_i^2$ for numerator polynomials, and $q_i = \gamma_i^2 |h_i|^2$ for denominator polynomials, where $|h_i|^2$ is the magnitude squared of the complex frequency response function data, and $\gamma_i^2$ is the inputted coherence of the data.

GENERATION OF COMPLEX FORSYTHE POLYNOMIALS FROM REAL FORSYTHE POLYNOMIALS

The complex Forsythe polynomials above have the following properties:

1. Half Symmetry:

$P^+_{i,k} = P^-_{i,k}$ for even k; and
    $P^+_{i,k} = -P^-_{i,k}$ for odd k, where $P^+_{i,k}$ is a right half function, defined for i>0 only, and $P^-_{i,k}$ is a left half function, defined for i<0 only.

2. Orthogonality:

For numerator polynomials, $$\sum_{i=1}^{L} \phi^*_{i,k} \phi_{i,j} \gamma_i^2 = \begin{cases} 0.5 & \text{for } k=j \\ 0 & \text{for } k \neq j \end{cases} \quad (6)$$

and for denominator polynomials, $$\sum_{i=1}^{L} \theta^*_{i,k} |h_i|^2 \gamma_i^2 \theta_{i,j} \gamma_i^2 = \begin{cases} 0.5 & \text{for } k=j \\ 0 & \text{for } k \neq j \end{cases} \quad (7)$$

3. Generation of complex Forsythe polynomials from the real Forsythe polynomials:

$P_{i,k} = (j)^k R_{i,k}$ where $R_{i,k}$ is the real Forsythe polynomial of order k at frequency i, and $P_{i,k}$ is the complex Forsythe polynomial of order k at frequency i.

By applying the half symmetry and orthogonality relations shown above, the real polynomials $R_{i,k}$ are generated as follows:

$R_{i,-1} = 0$ \quad (8)

$$R_{i,0} = \left( 2 \sum_{i=1}^{L} q_i \right)^{-1/2}$$

$S^{i,k} = \omega_i R_{i,k-1} - V_{k-1} R_{i,k-2}$ where:

$$V_{k-1} = 2 \sum_{i=1}^{L} \omega_i R_{i,k-1} R_{i,k-2} q_i \quad (9)$$

$R_{i,k} = S_{i,k} / D_k$ $$D_k = \left( 2 \sum_{i=1}^{L} (S_{i,k})^2 q_i \right)^{1/2}$$

Forsythe polynomials provide the following advantages over ordinary polynomials and over other orthogonal polynomials:

1. a least squares system matrix obtained from the least squares formulation for ordinary polynomials is ill-conditioned relative to the least squares system matrix obtained by orthogonal polynomials;
2. Forsythe polynomials allow for the use of arbitrary weighting of individual data points while retaining its orthogonality; and
3. Forsythe polynomials allow arbitrary spacing of the input data points of the frequency response data.

LEAST SQUARES FORMULATION

The least squares error generally is defined as the difference between the rational fraction model and the measured transfer function at frequency $\omega_i$:

$$\epsilon_i = H(s_i) - h_i = \frac{N(s_i)}{D(s_i)} - h_i \qquad (10)$$

Since the definition of the error in Eq. (10) yields a non-linear least squares problem, an alternative definition is used by the disclosed filter synthesizer apparatus and method:

$$\begin{aligned}\epsilon_i &= (N(s) - h_i D(s))\gamma_i \\ &= \left\{ \sum_{k=0}^{M} c_k \phi_{i,k} - h_i \left\{ \sum_{k=0}^{N-1} d_k \theta_{i,k} + \theta_{i,N} \right\} \right\} \gamma_i \end{aligned} \qquad (11)$$

where $d_N = 1$.

Equation (11) may be reformulated in matrix form as:

$$E = PC - TD - W \qquad (12)$$

with $$E = \begin{Bmatrix} e_1 \\ e_2 \\ \cdot \\ \cdot \\ \cdot \\ e_L \end{Bmatrix} \quad P = \begin{bmatrix} \gamma_1 \phi_{1,0} & \gamma_1 \phi_{1,1} & \cdots & \gamma_1 \phi_{1,M} \\ \gamma_2 \phi_{2,0} & \gamma_2 \phi_{2,1} & \cdots & \gamma_2 \phi_{2,M} \\ \cdot & \cdot & & \cdot \\ \cdot & \cdot & & \cdot \\ \cdot & \cdot & & \cdot \\ \gamma_L \phi_{L,0} & \gamma_L \phi_{L,1} & \cdots & \gamma_L \phi_{L,M} \end{bmatrix} \qquad (13)$$

$$C = \begin{Bmatrix} c_0 \\ c_1 \\ \cdot \\ \cdot \\ \cdot \\ c_M \end{Bmatrix} \qquad (14)$$

$$T = \begin{bmatrix} \gamma_1 h_1 \theta_{1,0} & \gamma_1 h_1 \theta_{1,1} & \cdots & \gamma_1 h_1 \theta_{1,N-1} \\ \gamma_2 h_2 \theta_{2,0} & \gamma_2 h_2 \theta_{2,1} & \cdots & \gamma_2 h_2 \theta_{2,N-1} \\ \cdot & \cdot & & \cdot \\ \cdot & \cdot & & \cdot \\ \cdot & \cdot & & \cdot \\ \gamma_L h_L \theta_{L,0} & \gamma_L h_L \theta_{L,1} & \cdots & \gamma_L h_L \theta_{L,N-1} \end{bmatrix}$$

$$D = \begin{Bmatrix} d_0 \\ d_1 \\ \cdot \\ \cdot \\ \cdot \\ d_{N-1} \end{Bmatrix} \quad W = \begin{Bmatrix} \gamma_1 h_1 \theta_{1,N} \\ \gamma_2 h_2 \theta_{2,N} \\ \cdot \\ \cdot \\ \cdot \\ \gamma_L h_L \theta_{LN} \end{Bmatrix} \qquad (15)$$

The alternative definition of the error gives the least squares cost function as:

$$J = \sum_{i=1}^{L} e^*_i e_i = E^H E. \qquad (16)$$

This cost function J uses the coherence $\gamma^2$ input in the frequency response data for weighting the data points by their quality; i.e. their relative closeness to an ideal value with the ideal coherence being 1.

After minimizing the cost function J in step 34 in FIG. 2 with respect to the unknown coefficients C and D, the orthogonality relationships of Eq. (6)–(7) and the relation $$A^H B + B^H A = 2 Re(A^H B) = 2 Re(B^H A)$$

are applied to the minimized cost function J to form the least squares system of equations:

$$\begin{bmatrix} I_1 & X \\ X^T & I_2 \end{bmatrix} \begin{Bmatrix} C \\ D \end{Bmatrix} = \begin{Bmatrix} H \\ 0 \end{Bmatrix} \qquad (17)$$

where the elements of the above Eq. (17) are:

$H = 2\, Re\{P^H W\}$ having dimensions (M+1×1);
$X = -2\, Re\{P^H T\}$ having dimensions (M+1×N);
C=numerator coefficients having dimensions (M+1×1);
D=denominator coefficients having dimensions (N×1);
$I_1$=identity matrix having dimensions (M+1×M+1);
$I_2$=identity matrix having dimensions (N×N); and
0=a zero vector having dimensions (N×1).

Each of the above equations are real; i.e. matrices and vectors having real valued elements.

GENERATION OF TERMS IN THE LEAST SQUARES SYSTEM OF EQUATIONS

Since the complex Forsythe polynomials are generated from the real Forsythe polynomials as follows:

$$\phi^*_{i,m} = j^{-m}\{Re(\phi_{i,m})\} \qquad (18)$$

$$\theta_{i,n} = j^n\{Re(\theta_{i,n})\}$$

then, by the definition of matrix X, $$\begin{aligned} X_{mn} &= 2Re\left(\sum_{i=1}^{L} \gamma_i^2 \phi_{i,m}^* h(s) \theta_{i,n}\right) \\ &= 2Re\left(\sum_{i=1}^{L} \gamma_i^2 \phi_{i,m}^* h(j\omega_i) \theta_{i,n}\right) \\ &= 2\left[ j^{n-m} \sum_{i=1}^{L} \gamma_i^2 Re(\phi_{i,m})\{Re(h_i) + jIm(h_i)\} Re(\theta_{i,n}) \right] \\ &= 2\left[ j^{n-m} \sum_{i=1}^{L} \gamma_i^2 Re(\phi_{i,m}) Re(h_i) Re(\phi_{i,n}) + \right. \\ &\qquad \left. j^{n-m+1} \sum_{i=1}^{L} \gamma_i^2 Re(\phi_{i,m}) Im(h_i) Re(\theta_{i,n}) \right] \\ &= A_{mn} + B_{mn} \end{aligned} \qquad (19)$$

where:

$A_{mn}$, $B_{mn}$ are defined to be the respective summations above;

$X = X_{mn}$ when $m = 0 \to M$ and $n = 0 \to (N-1)$;

$H = X_{mn}$ when $m = 0 \to M$ and $n = N$;

$\phi_{i,m}$ is the denominator polynomial, which is even (or odd) when m is even (or odd, respectively);

$\theta_{i,m}$ is the numerator polynomial, which is even (or odd) when m is even (or odd, respectively);

$Re(h_i)$ is the real part of the measured data $h_i$ at frequency i, and is even;

$Im(h_i)$ is the imaginary part of the measured data $h_i$ at frequency i, and is odd;

$A_{mn} = 0$ when m is even and n is odd, or when m is odd and n is even; and $B_{mn} = 0$ when m and n are both even, or when m and n are both odd.

Vector H and matrix X in Eq. (17) are then generated according to Eq. (18)–(19) above.

The numerator coefficients C and denominator coefficients D are then solved according to:

$$\{I_2 - X^T X\} D = -X^T H \quad C = H - X D.$$

ROOT SOLVING USING A COMPANION MATRIX

The poles of the transfer function are then determined in step 40 in FIG. 2 by solving for the eigenvalues of the orthogonal denominator polynomial using a companion matrix formulation, which is a technique that is generally much better conditioned than standard approaches of solving for the roots of ordinary polynomials. For example, the companion matrix method is known to accurately determine the roots of $40^{th}$ order polynomials.

Referring to FIG. 3, the companion matrix formulation involves constructing the companion matrix from the polynomial by the following steps:

1) referring to Eq. (8)–(9),
$$S_{i,k}=D_k R_{i,k}=\omega_i R_{i,k-1}-V_{k-1} R_{i,k-2}$$
then:
$$\omega_i R_{i,k-1}=D_k R_{i,k}+V_{k-1} R_{i,k-2};$$

2) multiply the above through by $j^k$:
$$(j \omega_i) j^{k-1} R_{i,k-1}=D_k j^k R_{i,k}+V_{k-1} j^{k-2} R_{i,k-2} j^2 \; s \; P_{i,k-1}= D_k P_{i,k}-V_{k-1} P_{i,k-2};$$

3) generate the following values recursively:

$$s P_{i,0} = D_1 P_{i,1}$$
$$s P_{i,1} = D_2 P_{i,2} - V_1 P_{i,0}$$
$$\vdots$$
$$s P_{i,N-2} = D_{N-1} P_{i,N-1} - V_{N-2} P_{i,N-3},$$
$$s P_{i,N-1} = D_N P_{i,N} - V_{N-1} P_{i,N-2},$$

which determines $$sP_{i,N-1} = \left\{ -D_N \sum_{k=0}^{N-1} d_k P_{i,k} \right\} - V_{N-1} P_{i,N-2}$$

4) determine the roots of P(s) from $$P_{i,N} + \sum_{k=0}^{N-1} d_k P_{i,k} = 0 \quad (21)$$

where $d_N = 1$;

5) generate a companion matrix $M_C$:

$$M_C = \begin{bmatrix} 0 & D_1 & 0 & \ldots & 0 & 0 \\ -V_1 & 0 & D_2 & 0 & & \cdot \\ & & & & & \cdot \\ 0 & -V_2 & 0 & D_3 & 0 & \cdot \\ \cdot & \cdot & \cdot & \cdot & \cdot & \\ \cdot & \cdot & \cdot & \cdot & \cdot & 0 \\ \cdot & \cdot & \cdot & \cdot & \cdot & \\ 0 & \ldots & 0 & -V_{N-2} & 0 & D_{N-1} \\ -D_N d_0 & -D_n d_1 & \ldots & \ldots & -V_{N-1}-D_N d_{N-1} & -D_N d_{N-1} \end{bmatrix} \quad (22)$$

which is a lower Hessenberg matrix;

6) generate a lower Hessenberg matrix equation:

$$M_C \begin{Bmatrix} P_{i,0} \\ P_{i,1} \\ \cdot \\ \cdot \\ \cdot \\ \cdot \\ P_{i,N-2} \\ P_{i,N-1} \end{Bmatrix} = s \begin{Bmatrix} P_{i,0} \\ P_{i,1} \\ \cdot \\ \cdot \\ \cdot \\ \cdot \\ P_{i,N-2} \\ P_{i,N-1} \end{Bmatrix} \quad (23)$$

7) determine the eigenvalues via QR decomposition, which is a matrix eigenvalue decomposition technique known in the art; and 8) determining the poles $p_r$ to be the determined eigenvalues.

STABILIZATION OF UNSTABLE POLES

Referring to FIG. 3, if any of the poles have positive real parts, the transfer function is unstable. In order to make it stable, the disclosed filter synthesizer 10, in an alternative embodiment, reflects the poles into the left half plane according to:

$$Re(p_r)=-Re(p_r) \text{ for } Re(p_r)>0.$$

Then the numerator is refit in step 64 of FIG. 3, to provide for the reflected poles. First, Eq. (1) is expressed in the form:

$$H(s_i) = \sum_{r=1}^{MODES} \left[ \frac{A_r}{s_i - p_r} + \frac{A_r^*}{s_i - p_r^*} \right] \quad (24)$$

$$= \sum_{r=1}^{MODES} B_r(s_i) Re(A_r) + C_r(s_i) Im(A_r)$$

where:

-continued $$B_r(\omega_i) = \frac{2(j\omega_i - Re(p_r))}{D_r(\omega_i)} \quad (25)$$

$$C_r(\omega_i) = \frac{-2Im(p_r)}{D_r(\omega_i)}$$

$$= Re(p_r)^2 + Im(p_r)^2 - \omega_i^2 - 2jRe(p_r)\omega_i$$

$$= s_i^2 + \omega_r^2 + 2j\xi_r\omega_r\omega_i$$

The cost function is then defined to be:

$$J = \sum_{r=1}^{MODES} \gamma_i^2 |h_i - H(s_i)|^2 = \sum_{r=1}^{MODES} |\bar{h}_i - v_i x|^2 \quad (26)$$

where:
$$\bar{h}_i = \gamma_i h_i, \quad (27)$$
and $$x^T = \begin{Bmatrix} Re(A_1) \\ Im(A_1) \\ \cdot \\ \cdot \\ \cdot \\ RE(A_{MODES}) \\ Im(A_{MODES}) \end{Bmatrix} \quad v_i = \gamma_i \begin{Bmatrix} B_1(\omega_i) \\ C_{11}(\omega_i) \\ \cdot \\ \cdot \\ \cdot \\ B_{MODES}(\omega_i) \\ B_{MODES}(\omega_i) \end{Bmatrix} \quad (28)$$

By differentiating the above cost function with respect to x and then setting the derivative to zero, the following system of equations results:

$$Mx = b$$

where:

$$M = \sum_{i=1}^{L} Re(v_i v_i^H) \quad (29)$$

$$b = \sum_{i=1}^{L} Re(v_i \bar{h}_i^*)$$

and then the residues are obtained in step 66 of FIG. 3 by solving for x in the above equation.

DETERMINATION OF MODAL PARAMETERS

If there are no unstable poles and the frequencies have been normalized by the maximum frequency input to provide that the orthogonal polynomials are better conditioned, then the transfer function is expanded by partial fractions to obtain the residues according to:

$$A_r = \omega_{max} \left\{ \frac{N(s)}{\prod_{\substack{i=1 \\ i \neq r}}^{N} (s - p_i)} \right\}_{s=p_r} \quad (30)$$

If there are unstable poles, then the residues are multiplied by the maximum frequency $\omega_{max}$ to obtain new values $(A_{STABLE})_r$ for the residues of a stable filter:

$$(A_{STABLE})_r = (Re(A_r) + Im(A_r))\omega_{max} \quad (31)$$

Then the natural frequency and the damping ratio are determined as follows:

$$\omega_r = |p_r|\omega_{max} \quad (32)$$

$$\zeta_r = -Re(p_r)\omega_{max}/\omega_r$$

EXAMPLE OF MODAL PARAMETER ESTIMATION

Referring to TABLES 1–3 below, TABLE 1 illustrates exemplary input frequencies and transfer function data used by the disclosed filter synthesizer apparatus and method to generate the modal parameters and transfer function. In a first mode, the disclosed filter synthesizer apparatus and method generates modal parameters corresponding to an analog filter according to Eqs. (1)–(2) with output modal parameters as shown in TABLE 2 below, and having 23 modes. A corresponding graphical representation may be generated as shown in FIGS. 4–5, in which the generated transfer function 70 corresponding to Eq. (1) above is plotted against the actual frequency response data 72. For a predetermined transfer function bandwidth of frequencies for frequency response data fitting, the generated transfer function 70 having the generated modal parameters provides an accurate filter synthesized from the input frequency response data 72.

Alternatively, as shown in TABLE 3 below with illustrative output IIR coefficients the disclosed filter synthesizer apparatus and method operates in a second mode to generate a digital filter having a set of infinite impulse response (IIR) coefficients corresponding to a Z-domain filter having a transfer function:

$$H(z) = \sum_{i=1}^{MODES} \frac{a_{0,i} + a_{1,i}z^{-1} + a_{2,1}z^{-2}}{1 + b_{1,i}z^{-1} + b_{2,i}z^{-2}}$$

which may be obtained from a sample and hold transformation or an impulse invariant transformation of the analog transfer function determined by the disclosed filter synthesizer.

While the disclosed filter synthesizer and method has been particularly shown and described with reference to the preferred embodiments, it will be understood by those skilled in the art that various modifications in form and detail may be made therein without departing from the scope and spirit of the invention. Accordingly, modifications such as those suggested above, but not limited thereto, are to be considered within the scope of the invention.

TABLE 1

| FREQ (Hz) | Re ($h_r$) | Im ($h_r$) | coherence |
|---|---|---|---|
| 0.0000000e+00 | 1.43390844e+02 | 1.85615742e+01 | 5.29291015e−03 |
| 5.0000000e−01 | −2.44532537e+02 | 9.24663466e+01 | 7.01695010e−02 |
| 1.0000000e+00 | −4.57272797e+02 | −2.96503891e+02 | 1.35288000e−01 |
| 1.5000000e+00 | −4.45377863e+02 | −5.36944766e+02 | 1.16866998e−01 |

TABLE 1-continued

| FREQ (Hz) | Re ($h_r$) | Im ($h_r$) | coherence |
|---|---|---|---|
| 2.0000000e+00 | −3.34317891e+02 | −3.78750388e+02 | 3.77525985e−02 |
| 2.5000000e+00 | −2.80387365e+02 | 1.40290890e+02 | 1.48703000e−02 |
| 3.0000000e+00 | −1.56910280e+02 | 3.40457331e+02 | 3.56835015e−02 |
| 3.5000000e+00 | −4.24702423e+00 | 1.31305798e+02 | 1.18431998e−02 |
| 4.0000000e+00 | 3.96244054e+01 | −6.44794031e+01 | 5.26646012e−03 |
| 4.5000000e+00 | 1.57181648e+01 | −4.04184484e+01 | 2.12945999e−03 |
| 5.0000000e+00 | 5.54143798e+00 | −2.69429903e+00 | 1.09480003e−04 |
| 5.5000000e+00 | 4.11363370e+00 | 2.49455464e+00 | 1.07448002e−04 |
| 6.0000000e+00 | 1.48555938e+00 | 2.35327387e+00 | 5.57571002e−05 |
| 6.5000000e+00 | −1.90695883e+00 | −4.75126554e−01 | 4.71321000e−05 |
| 7.0000000e+00 | −2.56673669e+00 | −4.08202310e+00 | 1.86992998e−04 |
| 7.5000000e+00 | −2.10418864e+00 | −5.90404468e+00 | 2.06658005e−04 |
| 8.0000000e+00 | −2.75784788e+00 | −5.08457758e+00 | 1.95827000e−04 |
| 8.5000000e+00 | −3.71245113e+00 | −3.66686789e+00 | 3.05416004e−04 |
| 9.0000000e+00 | −4.27286956e+00 | −4.49329484e+00 | 6.66245993e−04 |
| 9.5000000e+00 | −6.69427098e+00 | −7.37662203e+00 | 1.34691002e−03 |
| 1.0000000e+01 | −1.43503543e+01 | −1.02562219e+01 | 4.37548012e−03 |
| 1.0500000e+01 | −2.76981450e+01 | −6.81790009e+00 | 1.40025998e−02 |
| 1.1000000e+01 | −3.54794125e+01 | 6.53693577e+00 | 1.93285998e−02 |

TABLE 2

| r | $\omega_r$ | $\zeta_r$ | $R_r$ | $I_r$ | $PHASE_r = TAN^{-1} (I_r/R_r)$ |
|---|---|---|---|---|---|
| 1 | 0.2759601E+02 | 0.6742713E−01 | 0.3494649E+04 | −0.1030905E+04 | −0.1643582E+02 |
| 2 | 0.3349071E+02 | 0.5799426E−01 | 0.2145914E+05 | −0.4475507E+04 | −0.1178070E+02 |
| 3 | 0.4188037E+02 | 0.4193770E−01 | 0.2395049E+05 | −0.2528125E+05 | −0.4654836E+02 |
| 4 | 0.4591962E+02 | 0.3378644E−01 | 0.3515158E+05 | −0.3045034E+05 | −0.4090101E+02 |
| 5 | 0.5151190E+02 | 0.2349997E+00 | −0.8094492E+05 | 0.1595302E+06 | 0.1169030E+03 |
| 6 | 0.6752827E+02 | 0.2163127E−01 | 0.7153616E+04 | −0.213954BE+04 | −0.1665120E+02 |
| 7 | 0.7369303E+02 | 0.5746188E−01 | −0.3913963E+05 | 0.4896795E+05 | 0.1286350E+03 |
| 8 | 0.8484329E+02 | 0.1688425E−01 | 0.3955609E+04 | −0.2796344E+05 | −0.8194856E+02 |
| 9 | 0.9067541E+02 | 0.4363573E−01 | −0.1733917E+06 | 0.9339631E+03 | 0.1796914E+03 |
| 10 | 0.9506322E+02 | 0.3054697E−01 | −0.5465492E+03 | 0.1175805E+05 | 0.9266136E+02 |
| 11 | 0.9776202E+02 | 0.5446233E−02 | 0.1647628E+04 | −0.1938975E+04 | −0.4964405E+02 |
| 12 | 0.1070824E+03 | 0.1499417E−01 | 0.4320550E+04 | −0.1143851E+05 | −0.6930746E+02 |
| 13 | 0.1071789E+03 | 0.2702670E−01 | −0.1126511E+06 | −0.1044423E+06 | −0.1311655E+03 |
| 14 | 0.1127423E+03 | 0.1611742E−02 | 0.1130233E+03 | −0.9743101E+01 | −0.8338307E+02 |
| 15 | 0.1154878E+03 | 0.1732243E−01 | 0.7510819E+05 | 0.9755548E+05 | 0.5240724E+02 |
| 16 | 0.1158380E+03 | 0.2199115E−01 | −0.5170776E+05 | −0.5816652E+05 | −0.1316358E+03 |
| 17 | 0.1233358E+03 | 0.2077480E−01 | −0.4756472E+05 | −0.1144858E+06 | −0.1125611E+03 |
| 18 | 0.1329699E+03 | 0.1054639E−01 | −0.3977699E+04 | −0.2328634E+05 | −0.9969353E+02 |
| 19 | 0.1409658E+03 | 0.8616349E−02 | −0.1482759E+05 | −0.2213836E+05 | −0.1238130E+03 |
| 20 | 0.1450902E+03 | 0.6873103E−02 | −0.1770953E+05 | 0.3108278E+04 | 0.1700452E+03 |
| 21 | 0.1490662E+03 | 0.6485020E−02 | −0.3513098E+05 | −0.1566162E+05 | −0.1559642E+03 |
| 22 | 0.1557621E+03 | 0.3135359E−02 | −0.5771978E+04 | 0.6213541E+04 | 0.1328901E+03 |
| 23 | 0.1569982E+03 | 0.9701740E−02 | −0.1162256E+06 | −0.1836696E+04 | −0.1790946E+03 |

TABLE 3

| $a_{0,1}$ | $a_{1,i}$ | $a_{2,i}$ | $b_{1,i}$ | $b_{2,i}$ |
|---|---|---|---|---|
| 0.000000E+00 | 0.344131E+01 | −.333745E+01 | −.198152E+01 | 0.988648E+00 |
| 0.000000E+00 | 0.210804E+02 | −.205111E+02 | −.197767E+01 | 0.988153E+00 |
| 0.000000E+00 | 0.248392E+02 | −.215659E+02 | −.197288E+01 | 0.989281E+00 |
| 0.000000E+00 | 0.362166E+02 | −.318941E+02 | −.297081E+01 | 0.990526E+00 |
| 0.000000E+00 | −.889465E+02 | 0.631070E+02 | −.1904398E+01 | 0.928414E+00 |
| 0.000000E+00 | 0.713562E+01 | −.667526E+01 | −.194850E+01 | 0.991077E+00 |
| 0.000000E+00 | −.429822E+02 | 0.318847E+02 | −.192411E+01 | 0.974352E+00 |
| 0.000000E+00 | 0.733435E+01 | −.281386E+00 | −.192417E+01 | 0.991249E+00 |
| 0.000000E+00 | −.166277E+03 | 0.164011E+03 | −.190005E+01 | 0.976014E+00 |
| 0.000000E+00 | −.217590E+01 | −.112299E+01 | −.189863E+01 | 0.982340E+00 |
| 0.000000E+00 | 0.186524E+01 | −.129989E+01 | −.190760E+01 | 0.996738E+00 |
| 0.000000E+00 | 0.594603E+01 | −.230692E+01 | −.188377E+01 | 0.990209E+00 |
| 0.000000E+00 | −.910517E+02 | 0.123022E+03 | −.187618E+01 | 0.982383E+00 |
| 0.000000E+00 | 0.271014E+00 | 0.547010E−01 | −.188050E+01 | 0.998886E+00 |

TABLE 3-continued

| $a_{0,i}$ | $a_{1,i}$ | $a_{2,i}$ | $b_{1,i}$ | $b_{2,i}$ |
|---|---|---|---|---|
| 0.000000E+00 | 0.549744E+02 | −.877258E+02 | −.186433E+01 | 0.987800E+00 |
| 0.000000E+00 | −.393158E+02 | 0.587438E+02 | −.186049E+01 | 0.984491E+00 |
| 0.000000E+00 | −.243863E+02 | 0.654950E+02 | −.184403E+01 | 0.984401E+00 |
| 0.000000E+00 | 0.791552E+00 | 0.830127E+01 | −.182801E+01 | 0.991432E+00 |
| 0.000000E+00 | −.941621E+01 | 0.185338E+02 | −.180912E+01 | 0.992575E+00 |
| 0.000000E+00 | −.173670E+02 | 0.159902E+02 | −.179960E+01 | 0.993900E+00 |
| 0.000000E+00 | −.296440E+02 | 0.364007E+02 | −.178916E+01 | 0.994086E+00 |
| 0.000000E+00 | −.684166E+01 | 0.399273E+01 | −.197329E+01 | 0.997008E+00 |
| 0.000000E+00 | −.108492E+03 | 0.108817E+03 | −.176421E+01 | 0.990698E+00 |

What is claimed is:

1. An apparatus for generating modal parameters of a frequency response system, the apparatus comprising:
   a processing unit including a processor, associated memory, and stored programs;
   the associated memory for storing frequency response data of the frequency response system, including coherence values;
   the stored programs include a modal analysis program; and
   the processor, operating the modal analysis program, for processing the frequency response data, for generating orthogonal polynomial data from a cost value generated from a cost function applied to the frequency response data including coherence values, and for generating the modal parameters of a transfer function from the orthogonal polynomial data.

2. The apparatus of claim 1 further comprising:
   a data source providing the frequency response data; and
   the associated memory for receiving and storing the frequency response data from the data source.

3. The apparatus of claim 1 wherein the processor generates the orthogonal polynomial data representing Forsythe polynomials.

4. The apparatus of claim 1, wherein the processor generates the orthogonal polynomial data from least squares processing of the cost value generated from the cost function applied to the frequency response data, including coherence values.

5. The apparatus of claim 1 wherein the processor generates the modal parameters, including a pole of the transfer function.

6. The apparatus of claim 5, wherein the processor generates first orthogonal polynomial data corresponding to a first transfer function, determines an instability condition from the pole, responds to the instability condition to generate second orthogonal polynomial data corresponding to a stable transfer function, and generates the modal parameters from the second orthogonal polynomial data.

7. A filter synthesizer for generating a filter from frequency response data of a frequency response system, the filter synthesizer comprising:
   an input device for inputting the frequency response data, including coherence values;
   memory and stored programs for receiving and storing the frequency response data;
   a processor operating with the stored programs and including:
     means for processing the frequency response data;
     first means for generating first orthogonal polynomial data from a cost value generated from a cost function applied to the frequency response data including the coherence values, the generated first orthogonal polynomial data corresponding to a first transfer function relating to the frequency response data; and
     second means for generating modal parameters from the generated first orthogonal polynomial data; and
   an output device for outputting the generated first orthogonal polynomial data and the modal parameters corresponding to the first transfer function determining the synthesized filter.

8. The filter synthesizer of claim 7 wherein the first means includes means for performing a least squares optimization of the frequency response data, including the coherence values, to minimize the cost value generated from the cost function in generating the orthogonal polynomial data.

9. The filter synthesizer of claim 7 wherein the first means generates the first orthogonal polynomial data representing Forsythe polynomials.

10. The filter synthesizer of claim 7 wherein the second means for generating modal parameters including a residue corresponding to a pole, and for revising the residue in response to a condition of the pole being unstable.

11. The filter synthesizer of claim 7 wherein the second means determines a companion matrix from the first orthogonal polynomial data and the frequency response data and generates a pole as a eigenvalue of the companion matrix $M_c$ using QR decomposition according to:

$$M_C = Q \begin{bmatrix} R \\ O \end{bmatrix}$$

wherein Q is a unitary matrix, R is an upper triangular matrix, O is a null matrix, to generate the modal parameters.

12. The filter synthesizer of claim 7 wherein the first means determines a condition of an unstable pole of the first transfer function and processes the frequency response data using the unstable pole to generate a stable transfer function.

13. The filter synthesizer of claim 12 wherein the first means refits the first orthogonal polynomial data by reflecting the unstable pole about an axis and generating the refitted orthogonal polynomial data therefrom.

14. A method for generating modal parameters of a frequency response system, the method comprising the steps of:
   storing frequency response data, including coherence values, representing the frequency response system in memory;
   processing the frequency response data using a processor;
   minimizing a cost value generated from a cost function applied to the frequency response data, including the coherence values;
   generating first orthogonal polynomial data corresponding to a first transfer function of the frequency response system using the processor operating a modal analysis program; and generating the modal parameters from the first generated orthogonal polynomial data.

15. The method of claim 14 wherein the step of minimizing includes the step of performing a least squares optimization of the frequency response data, including the coherence values.

16. The method of claim 14 wherein the step of generating first orthogonal polynomial data includes the step of generating Forsythe polynomials.

17. The method of claim 14 wherein the step of generating modal parameters includes the steps of:

generating a residue corresponding to a pole; and revising the residue in response to a condition of the pole being unstable.

18. The method of claim 14 wherein the step of generating modal parameters includes the steps of:

determining a companion matrix from the first orthogonal polynomial data and the frequency response data;

performing QR decomposition on the companion matrix $M_c$, with $$M_C = Q \begin{bmatrix} R \\ O \end{bmatrix}$$

wherein Q is a unitary matrix, R is an upper triangular matrix, O is a null matrix; and generating a pole as a eigenvalue of the companion matrix from the QR decomposition.

19. The method of claim 14 further including the steps of:

determining a condition of an unstable pole of the first transfer function;

generating a stable pole;

processing the frequency response data using the stable pole to generate second orthogonal polynomial data; and generating a stable transfer function from the second orthogonal polynomial data.

20. The method of claim 19 wherein the step of generating a stable pole includes the step of reflecting the unstable pole about an axis; and the step of processing the frequency response data using the stable pole includes the step of using the reflected unstable pole to generate the second orthogonal polynomial data therefrom.

* * * * *